United States Patent [19]

Ogasahara et al.

[11] Patent Number: 4,477,689

[45] Date of Patent: Oct. 16, 1984

[54] CURRENT RELAYING DEVICE USED WITH SUPERCONDUCTOR APPARATUS

[75] Inventors: Hiroshi Ogasahara; Osatsugu Asai, both of Kobe; Takashi Sato, Kawanishi, all of Japan

[73] Assignee: Mitsubishi Denki Kabushiki Kaisha, Japan

[21] Appl. No.: 394,813

[22] Filed: Jul. 2, 1982

[30] Foreign Application Priority Data

Jul. 2, 1981 [JP] Japan .......................... 56-100095[U]

[51] Int. Cl.[3] ........................ H01R 4/68; H01L 39/02

[52] U.S. Cl. ................................ 174/15 CA; 174/13; 174/69; 339/9 E

[58] Field of Search .............. 174/13, 15 CA, 21 CA, 174/69, 86, 99 E; 339/9 E

[56] References Cited

U.S. PATENT DOCUMENTS 2,904,620 9/1959 Eichelberger et al. ....... 174/99 E X
4,187,387 2/1980 Parmer .......................... 174/15 CA
4,219,108 8/1980 Doring ........................... 339/9 E X
4,237,336 12/1980 Kostjukov et al. .............. 174/13 X

FOREIGN PATENT DOCUMENTS 914403 7/1954 Fed. Rep. of Germany ........ 174/69

OTHER PUBLICATIONS

"75KG High Field Superconducting Magnet—Design and Production", Mitsubishi Denki ENGINEER No. 26.2, Sep. 1970, pp. 2-8.

*Primary Examiner*—Laramie E. Askin
*Attorney, Agent, or Firm*—Leydig, Voit, Osann, Mayer and Holt, Ltd.

[57] ABSTRACT

The disclosed current relaying device comprises a corrugated strip of an electrically conducting material, a pair of strip-shaped conducting electric conductors connected to both ends of the corrugated strip, an electrically insulating casing for surrounding the corrugated strip throughout its length, and a pair of fixing and supporting members for enclosing both end portions of the casing.

2 Claims, 2 Drawing Figures

CURRENT RELAYING DEVICE USED WITH SUPERCONDUCTOR APPARATUS

BACKGROUND OF THE INVENTION

This invention relates to a current relaying device capable of expansion and contraction dependent upon a temperature difference and used with a superconductor apparatus.

A conventional current relaying device of the type referred to has comprised a cylindrical bus bar including both ends axially split, a pair of connecting electric conductors in the form of strips connected to the bus bar by having end portions thereof fitted into the split ends of the bus bar respectively, and a pin fixedly extending through each of the split ends of the bus bar and the end portion of the mating conductor fitted into that split end. Then, one of the connecting electric conductors has been connected to an electric source and the other conductor has been connected to a superconductor apparatus so that a current from the source is supplied via the current relaying device to the superconductor apparatus including a superconductor appliance, for example, a superconductor coil disposed within the particular cryostat which is maintained in cryogenic environment.

Therefore, a contraction occurs on the superconductor coil due to a temperature difference developed between the latter and surroundings. This contraction is applied to the current relaying device connected to the superconductor coil to produce a stress thereon. With the superconductor appliance small-sized, the contraction is small. Thus, conventional current relaying devices such as described above have been designed and constructed so that such a small contraction can be absorbed through an elongation of the bus bar disposed therein.

On the other hand, superconduction apparatus may be so dimensioned that a temperature difference between the superconductor appliance disposed in a mating cryostat and the exterior thereof on which a pair of associated source terminals are disposed cause the mating current relaying device to be expanded or contracted to an extent which cannot be disregarded. Under these circumstances, the current relaying device has yielded on either or both of those portions of the connecting conductors connected to the bus bar forming a current relaying portion, in view of the strength of materials. As a result, a permanent strain or strains would be caused. Alternatively, a break might occur.

Thus, conventional current relaying devices such as described above have been disadvantageous in that there is a limitation as to the dimension of superconductor apparatus with which the abovementioned structure of the devices can be used. Also, such current relaying devices have been disadvantageous in that there is a fear that the bus bar is connected to each of the connecting electric conductors in unstable electric contact relationship.

Accordingly, it is an object of the present invention to provide a new and improved current relaying device for use with a superconductor apparatus preventing a stress from occurring thereon due to a temperature difference.

SUMMARY OF THE INVENTION

The present invention provides a current relaying device for use with a superconductor apparatus comprising a current conducting member in the form of a strip bent into a corrugated shape, a pair of connecting electric conductors in the form of strips connected to both ends of the current conducting member, and an electrically insulating casing for surrounding the outer periphery of the current conducting member, the electrical insulating casing being externally held and fixed.

BRIEF DESCRIPTION OF THE DRAWING

The present invention will become more readily apparent from the following detailed description taken in conjunction with the accompanying drawing in which.

DESCRIPTION OF THE PREFERRED EMBODIMENT

Figure 1:
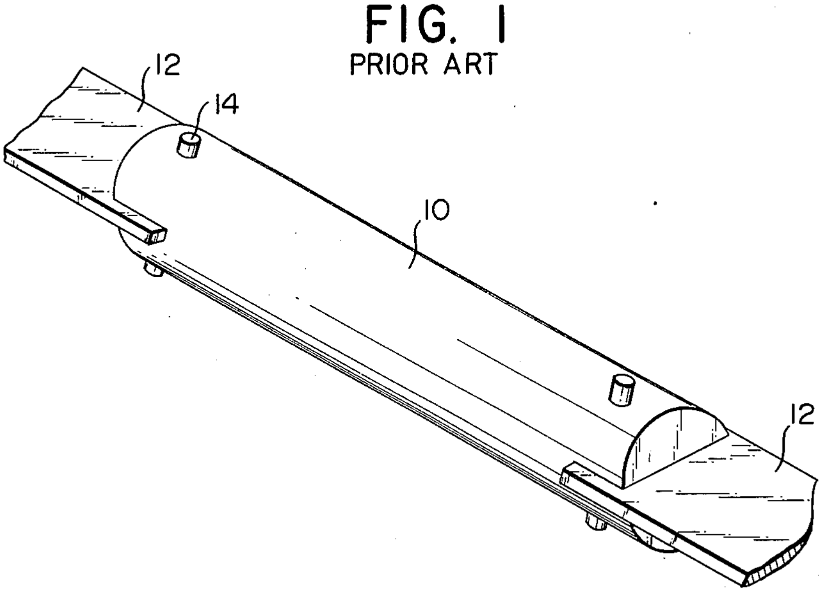
FIG. 1 PRIOR ART
FIG. 1 is a perspective view of a conventional current relaying device used with a superconductor apparatus.

Referring now to FIG. 1 of the drawing, there is illustrated a conventional current relaying device used with a superconductor apparatus. The arrangement illustrated comprises a cylindrical bus bar 10 including both ends axially split, a pair of connecting electric conductors 12 in the form of strips connected to the bus bar 10 by having end portions thereof fitted into the split ends of the bus bar 10 respectively, and a pin 14 fixedly extending through each end of the bus bar 10 and the end portion of each connecting electric conductor fitted into that split end to be perpendicular to the flat surface of the associated conductor 12.

Then, one of the connecting electric conductors 12 is connected to an electric source (not shown) and the other connecting conductor 12 is connected to a superconductor apparatus (not shown) so that a current from the source is supplied via the arrangement of FIG. 1 to the superconductor device, for example, a superconductor appliance such as a superconductor coil (not shown) disposed within an associated cryostat (not shown) which is maintained in cryogenic environment.

Therefore, the arrangement of FIG. 1 has been disadvantageous in the respects as described above.

The present invention contemplates to provide a current relaying device for use with a superconductor apparatus free from a stress occurring thereon due to a temperature difference developed between an associated superconductor appliance maintained in cryogenic environment and surroundings.

Figure 2:
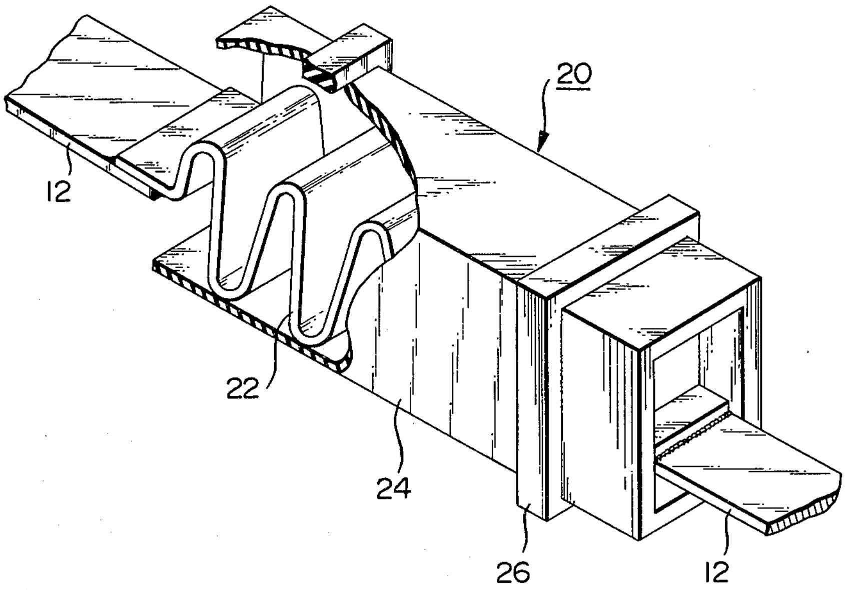
FIG. 2 is a perspective view of one embodiment according to the current relaying device of the present invention for use with a superconductor apparatus with a part cut away to illustrate the internal structure.

Referring now to FIG. 2, there is illustrated one embodiment according to the current relaying device of the present invention for use with a superconductor apparatus. The current relaying device is generally designated by the reference numeral 20 in FIG. 2 and comprises a current conducting member 22 of a good electrically conductive material, for example copper, in the form of a strip bent into a corrugated shape and including both ends connected to a pair of connecting electric conductors 12, respectively as by welding, and an electrically insulating casing 24 as shown in FIG. 2 as being of a rectangular cross section surrounding the outer periphery of the current conducting member 22 throughout its length so that the corrugated strip 22 includes valleys slidably disposed on the bottom surface of the casing 24 and corrugated edges slidably abutting against the bilateral side walls thereof. Thus, the corrugated strip 22 is prevented from being pendent or buckled. Furthermore the electrically insulating casing 24 serves to electrically insulate the strip or current conducting member 22 from the exterior thereof.

Then, the electrically insulating casing 24 is externally held and supported by having both end portions enclosed with a pair of fixing and supporting members 26 of an electrically insulating material in the form of frames complementary in cross section to the casing 24. Then, the fixing and supporting member 26 is held to an associated cryostat (not shown).

As in the arrangement of FIG. 1, one of the connecting electric conductors 12 is connected to an associated electric source (not shown) and the other conductor 12 is connected to an associated superconductor apparatus (not shown), for example, a superconductor appliance such as a superconductor coil (not shown) maintained in cryogenic environment in the superconductor apparatus and intended to be supplied with a current from the electric source.

In operation, the superconductor coil is much contracted due to a temperature difference developed between the same and surroundings. This contraction affects the current relaying device 20 connected to the superconductor coil, but it is absorbed by the corrugated strip 22. Also because of the current conducting member or strip 22 formed of a good electrically conductive material, a current from the source can be satisfactorily supplied to the superconductor coil through the connecting conductor 12. Furthermore, the current conducting member 22 can be simply held and electrically insulated by both the electrically insulating casing 24 disposed externally thereof and the opposite fixing and supporting frames 26 disposed around the casing on both end portions and connected to the associated cryostat (not shown).

From the foregoing it is seen that the present invention can completely absorb an expansion and a contraction of an associated superconductor appliance due to a temperature difference with a simple structure and relay a current without the occurrence of any excessive stress. In addition, the current conducting member is well held and effectively electrically insulated resulting in the stable supply of a current to an associated superconductor apparatus.

While the present invention has been illustrated and described in conjunction with a single preferred embodiment thereof, it is to be understood that numerous changes and modifications may be resorted to without departing from the spirit and scope of the present invention. For example, while the current conducting member has been formed of a normal electrically conducting material such as copper, it is to be understood that the same may be juxtaposed with and connected across a length of a superconducting wire for the purpose of shunting a current.

What is claimed is:

1. A current relaying device for use with a superconductor apparatus comprising a current conducting member in the form of a strip bent into a corrugated shape, a pair of connecting electric conductors in the form of strips connected to both ends of said current conducting member, an electrically insulating casing surrounding an outer periphery of said current conducting member, and a pair of electrically insulating frame members complementary in cross section to and each fixed to an end portion of said casing for externally supporting said casing, said current conducting member being supported solely by engaging an inside surface of said casing and being slideable lengthwise of said casing to absorb expansion and contraction of said superconductor apparatus transmitted to said current conducting member through one of said strips.

2. A current relaying device as claimed in claim 1 wherein said corrugated strip includes valleys slidably disposed on a bottom surface of said electrically insulating casing.

* * * * *